United States Patent
Kawazu et al.

(10) Patent No.: US 9,977,086 B2
(45) Date of Patent: May 22, 2018

(54) BATTERY MONITORING APPARATUS

(71) Applicant: DENSO CORPORATION, Kariya, Aichi-pref. (JP)

(72) Inventors: Shinsuke Kawazu, Kariya (JP); Masamitsu Shinbo, Iwata (JP)

(73) Assignee: DENSO CORPORATION, Kariya (JP)

( * ) Notice: Subject to any disclaimer, the term of this patent is extended or adjusted under 35 U.S.C. 154(b) by 332 days.

(21) Appl. No.: 14/964,981

(22) Filed: Dec. 10, 2015

(65) Prior Publication Data
US 2016/0178700 A1 Jun. 23, 2016

(30) Foreign Application Priority Data

Dec. 17, 2014 (JP) .................... 2014-255033

(51) Int. Cl.
| | |
|---|---|
| *F02N 11/08* | (2006.01) |
| *G01R 31/36* | (2006.01) |
| *F02N 11/10* | (2006.01) |
| *F02N 11/12* | (2006.01) |

(Continued)

(52) U.S. Cl.
CPC ...... *G01R 31/3606* (2013.01); *F02N 11/0862* (2013.01); *F02N 11/10* (2013.01); *F02N 11/12* (2013.01); *H02J 7/1461* (2013.01); *F02N 11/087* (2013.01); *F02N 11/0825* (2013.01); *F02N 11/0848* (2013.01); *F02N 2200/062* (2013.01); *F02N 2200/0801* (2013.01);
(Continued)

(58) Field of Classification Search
CPC ............. F02N 11/0848; F02N 11/0862; F02N 11/0825; F02N 11/10; F02N 2200/062; F02N 2200/0814; F02N 11/087; F02N 11/12; F02N 2200/0801; F02N 2200/101; F02N 2200/102; H02J 2001/006; H02J 7/1461
See application file for complete search history.

(56) References Cited

U.S. PATENT DOCUMENTS

| | | | | |
|---|---|---|---|---|
| 5,977,744 A | * | 11/1999 | Williams | .............. H02J 7/1423 320/104 |
| 6,605,946 B1 | | 8/2003 | Yokoyama | |

(Continued)

FOREIGN PATENT DOCUMENTS

| | | |
|---|---|---|
| JP | 2001-107768 A | 4/2001 |
| JP | 2007-146677 A | 6/2007 |

(Continued)

*Primary Examiner* — Freddie Kirkland, III
(74) *Attorney, Agent, or Firm* — Oliff PLC

(57) ABSTRACT

A battery monitoring apparatus is for a vehicle including a battery and a starter for starting an engine thereof by using electric power supplied from the battery. The battery monitoring apparatus includes a current obtaining section that obtains, as a discharge current value, a value of a discharge current flowing out from the battery while the engine is being started, a current determination section that determines whether or not the discharge current value is smaller than a predetermined threshold value, a start determination section that determines whether or not the engine has been started up, and a jump-start determination section that determines that the engine has been jump-started if the discharge current value is determined to be smaller than the threshold value and the engine is determined to have been started up.

6 Claims, 4 Drawing Sheets

(51) Int. Cl.
  *H02J 7/14*  (2006.01)
  *H02J 1/00*  (2006.01)
(52) U.S. Cl.
  CPC  *F02N 2200/0814* (2013.01); *F02N 2200/101* (2013.01); *F02N 2200/102* (2013.01); *H02J 2001/006* (2013.01)

(56) References Cited

U.S. PATENT DOCUMENTS

| | | | | |
|---|---|---|---|---|
| 7,427,865 | B2* | 9/2008 | Elder | B60L 3/0046 180/65.31 |
| 8,319,472 | B2* | 11/2012 | Gibbs | F02N 11/0866 307/10.6 |
| 8,843,299 | B2* | 9/2014 | Kawazu | F02N 11/0848 123/179.3 |
| 2010/0181959 | A1* | 7/2010 | Gibbs | F02N 11/0866 320/104 |
| 2011/0202263 | A1 | 8/2011 | Kawazu et al. | |
| 2016/0208762 | A1* | 7/2016 | Morita | F02N 11/0862 |

FOREIGN PATENT DOCUMENTS

| | | |
|---|---|---|
| JP | 2001-069681 A | 3/2011 |
| JP | 2011-163321 A | 8/2011 |

\* cited by examiner

BATTERY MONITORING APPARATUS

This application claims priority to Japanese Patent Application No. 2014-255033 filed on Dec. 17, 2014, the entire contents of which are hereby incorporated by reference.

BACKGROUND OF THE INVENTION

1. Field of the Invention

The present invention relates to a battery monitoring apparatus for monitoring a battery during start of an engine.

2. Description of Related Art

Since a vehicle battery deteriorates after long-term use, a jump-start of the engine of an own vehicle may need to be performed using electric power supplied from a rescue vehicle or the like when necessary.

There is known a technique in which a jump-start determination is made based on the voltage of the battery of an own vehicle to determine whether the engine of the own vehicle has been started normally using electric power of the battery of the own vehicle, or has been jump-started (that is, has been started using electric power supplied from a rescue vehicle).

Japanese Patent Application Laid-open No. 2001-107768 describes that an engine is determined to have been jump-started if the voltage of the battery of an own vehicle was higher than a predetermined threshold value immediately before starting the engine. The threshold value is set between the voltage of the battery when the engine is started normally, and the voltage of the battery when the engine is jump-started by being supplied with electric power from an alternator of a rescue vehicle.

However, the above described conventional technique has the problem as described in the following. In this conventional technique, if the engine of the rescue vehicle is stopped and accordingly the alternator of the rescue vehicle is out of operation, or if the alternator of the rescue vehicle is inhibited from generating electric power, there is a concern that the engine of the own vehicle may be determined to have not been jump-started, although it has been jump-started actually.

In vehicles provided with idling stop functionality, automatically stop of an engine is inhibited after the engine has been jump-started. Accordingly, if the jump-start determination is not made correctly, the idling stop function may be adversely affected.

SUMMARY

An exemplary embodiment provides a battery monitoring apparatus for a vehicle including a battery and a starter for starting an engine thereof by using electric power supplied from the battery, including:

a current obtaining section that obtains, as a discharge current value, a value of a discharge current flowing out from the battery while the engine is being started;

a current determination section that determines whether or not the discharge current value is smaller than a predetermined threshold value;

a start determination section that determines whether or not the engine has been started up; and a jump-start determination section that determines that the engine has been jump-started if the discharge current value is determined to be smaller than the threshold value and the engine is determined to have been started up.

According to the exemplary embodiment, there is provided a battery monitoring apparatus capable of correctly determining whether or not a vehicle has been jump-started irrespective of the power generation state of a rescue vehicle or the like.

Other advantages and features of the invention will become apparent from the following description including the drawings and claims.

PREFERRED EMBODIMENTS OF THE INVENTION

Figure 1:
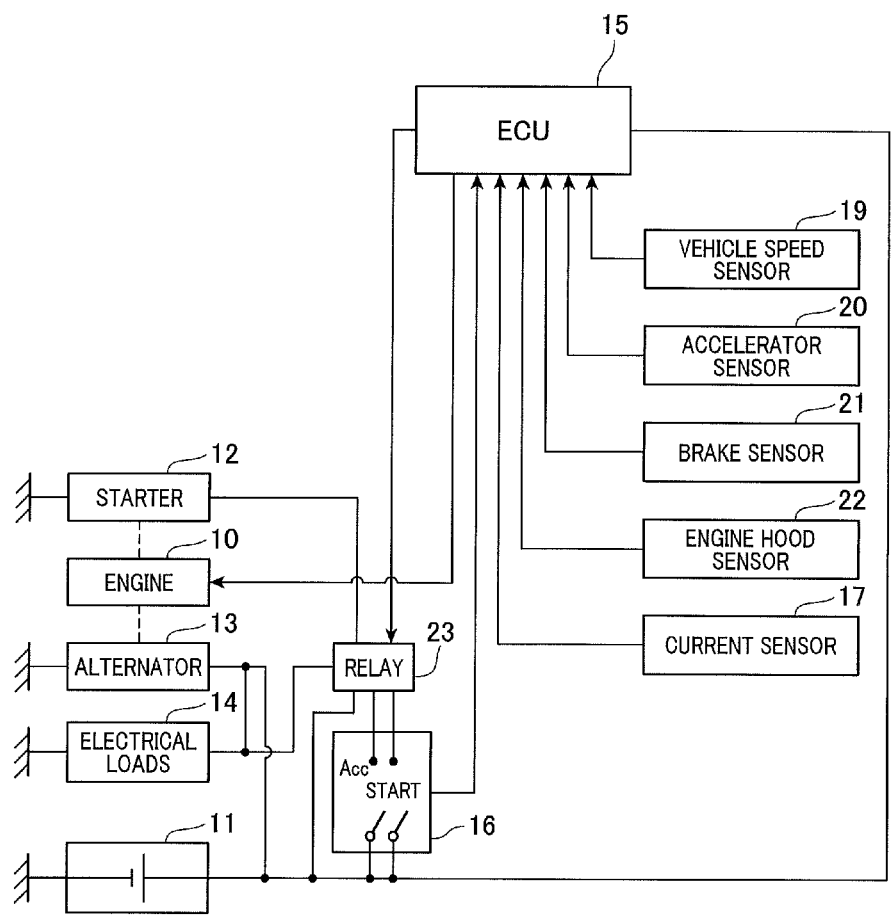
FIG. 1 is a diagram schematically showing the structure of an engine system of an own vehicle provided with a battery monitoring apparatus according to an embodiment of the invention.

FIG. 1 is a diagram schematically showing the structure of an engine system of an own vehicle having an engine 10, the own vehicle being provided with an idling stop function and a battery monitoring apparatus according to an embodiment of the invention.

As shown in FIG. 1, the engine 10 is provided with a starter 12 for starting the engine 10 by cranking the engine 10. The engine 10 is coupled to an alternator 13 through a belt or the like at its crankshaft. The alternator 13 is connected with a battery 11 and electrical loads 14 such as an audio device. The battery 11 is disposed in the engine compartment, and connected with the electrical loads 14 through an ignition switch 16. The alternator 13 is driven to rotate by the engine 10 to generate electric power to be supplied to the battery 11, the electrical loads 14 and so on.

The starter 12 is connected to the battery 11 through a relay 23 and the ignition switch 16. The starter 12 starts to be driven when the engine 10 is started manually by a vehicle driver's operation of an ignition key, or when the engine 10 is started automatically by the idling stop function. In the case of the manual start of the engine 10 by the vehicle driver, if the ignition key is set to a start position, the ignition switch 16 is closed to supply current to the relay 23. As a result, the relay 23 is closed to supply electric power to the starter 12 from the battery 11. Consequently, the starter 12 is driven to start the engine 10. In the case of the automatic start of the engine 10 by the idling stop function, the relay 23 is controlled to be closed to cause the starter 12 to start the engine 10.

The electrical loads 14 are supplied with electric power from the alternator 13 and the battery 11. Specifically, when the ignition key is set to the ACC position, the ACC switch of the ignition switch 16 is closed. As a result, the relay 23 disposed between the battery 11 and the electrical loads 14 is closed to supply electric power to the electrical loads 14 from the battery 11. While the engine 10 is stopped by the idling stop function, the relay 23 is controlled to be closed to supply electric power to the electrical loads 14 from the battery 11.

The engine control system includes various sensors including a current sensor 17 for detecting battery current, a vehicle speed sensor 19 for detecting the vehicle speed, an accelerator sensor 20 for detecting a depression amount of the accelerator pedal, a brake sensor 21 for detecting a depression amount of the brake pedal and an engine hood sensor 22 for detecting opening and closing of the engine hood. These sensors are connected to the ECU 15. The ECU 15 is constituted mainly of a microcomputer which includes a CPU, a ROM and a RAM, and executes various programs stored in the ROM. The ECU 13 starts up when the vehicle driver sets the ignition key to the IG position, and operates on electric power supplied from the battery 11.

The ECU 15 sends signals to the engine 10 to drive a fuel injection device and an ignition device in accordance with requirements to run the engine 10 and the running state of the engine 10. The ECU 15 controls power generation amount of the alternator 13 in accordance with the voltage of the battery 11, and the SOC (or the remaining capacity) of the battery 11. The SOC of the battery 11 can be calculated from the battery voltage or the battery current. The ECU 15 has a later-explained start determination function for determining whether the engine 10 has been jump-started or started normally.

The ECU 15 performs idling stop control in accordance with the vehicle speed, the depression amount of the accelerator pedal, the depression amount of the brake pedal, the voltage of the battery 11 and so on. Incidentally, it is possible that the engine control and the idling stop function are performed by different ECUs.

Next, an example of the jump-start and the jump-start determination are explained in detail. In this embodiment, it is determined whether the engine 10 has been jump-started or not based on a discharge current value Ib detected by the current sensor 17, the discharge current value Ib being the value of the discharge current flowing out from the battery 11 of the own vehicle 7 after the starter 12 starts to be supplied with electric power.

Figure 2:
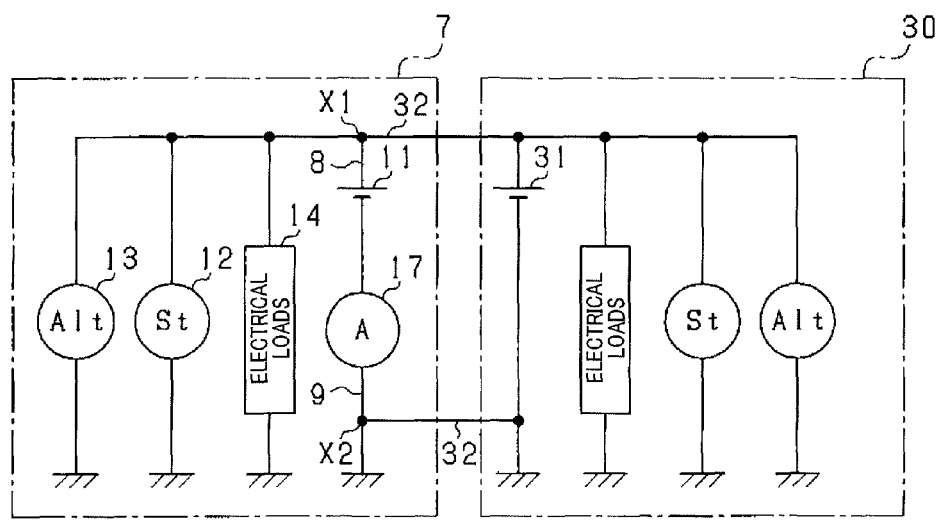
FIG. 2 is a diagram for explaining an example of electrical connection between the own vehicle and a rescue vehicle at the time of jump-starting the engine of the own vehicle.

FIG. 2 is a diagram for explaining an example of electrical connection between the own vehicle 7 and a rescue vehicle 30 at the time of jump-starting the engine 10 of the own vehicle 7. In the example of FIG. 2, the battery 11 of the own vehicle 7 and a battery 31 of the rescue vehicle 30 are connected to each other through a pair of booster cables 32. More specifically, the positive terminal of the battery 11 of the own vehicle 7 is connected to one end a positive side cable (a first wire) 8, the other end of the positive side cable 8 being connected with a connection member X1 which is connected with the starter 12, the alternator 13 and the electrical loads 14. The negative terminal of the battery 11 is connected to one end of a negative side cable (a second wire) 9, the other end of the negative side cable being connected with the vehicle body or a connection member X2 which is connected with the vehicle body. The connection member X1 of the own vehicle 7 and the positive terminal of the battery 31 of the rescue vehicle 30 are connected to each other through the positive side booster cable 32. On the other hand, the connection member X2 of the own vehicle 7 and the negative terminal of the battery 31 of the rescue vehicle 30 are connected to each other through the negative side booster cable 32. In such a connection state, electric power is supplied to the starter 12 of the own vehicle 7 from the battery 31 of the rescue vehicle 30 to jump-start the engine 10 of the own vehicle 7.

The current sensor 17 is provided in the negative side cable 9 for detecting the value of the battery current flowing through the battery 11. The value of the battery current detected by the current sensor 17 is outputted to the ECU 15. In this embodiment, the discharge current value Ib itself is detected by the current sensor 17 provided in the negative side cable 9. Connecting the negative side booster cable 32 to the connection member X2 (the vehicle body) is prescribed in an operation and maintenance manual or the like.

Figure 3:
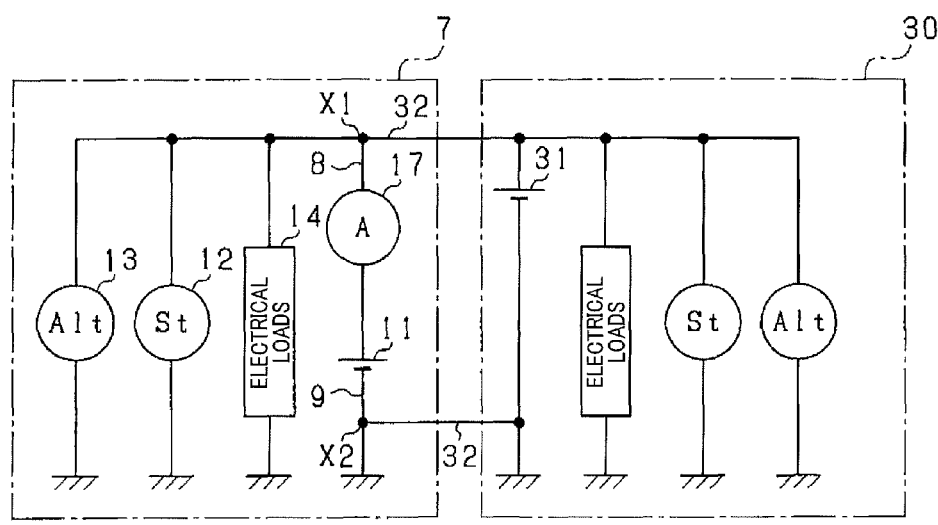
FIG. 3 is a diagram for explaining another example of electrical connection between the own vehicle and the rescue vehicle at the time of jump-starting the engine of the own vehicle.

FIG. 3 is a diagram for explaining another example of electrical connection between the own vehicle 7 and the rescue vehicle 30 at the time of jump-starting the engine 10 of the own vehicle 7. In this example, the current sensor 17 is provided in the positive side cable 8 of the own vehicle 7 to detect the discharge current value Ib of the battery 11.

To jump-start the engine 10, electric power is supplied from the battery 31 of the rescue vehicle 30 to the starter 12 of the own vehicle 7. At this time, the discharge current flowing out from the battery 11 of the own vehicle 7 decreases depending on the amount of electric power supplied from the rescue vehicle 30. Therefore, the discharge current value Ib when the engine 10 is jump-started is smaller than when the engine 10 is started normally. Accordingly, it is possible to make the jump-start determination based on the output of the current sensor 17.

Figure 4:
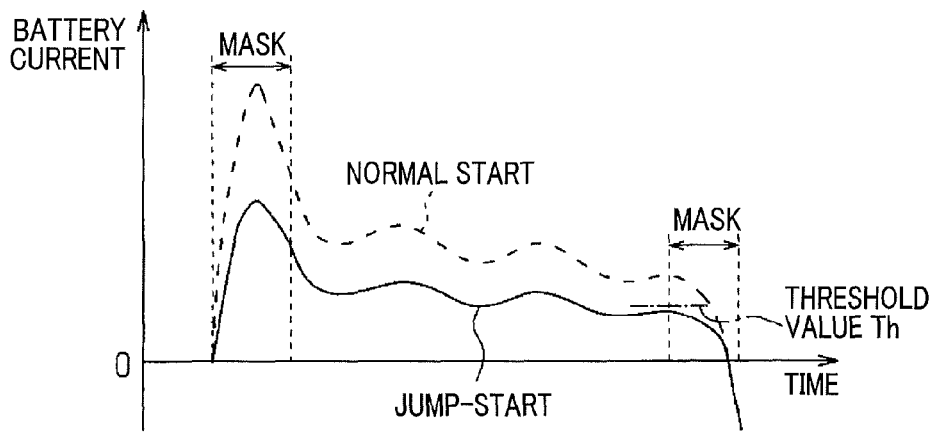
FIG. 4 is a graph showing temporal variations of a battery current during each of normal start and jump-start of the engine of the engine system.

FIG. 4 is a graph showing temporal variations of the battery current during each of the jump-start and the normal start of the engine 10. Here, it is assumed that the alternator 13 is stopped before starting the engine 10 and starts to generate electric power after the engine 10 has been started up.

As shown in FIG. 4, in each of the jump start and the normal start, a large current (an inrush current) flows when the starter 12 starts to be supplied with electric power, because no induced voltage is present in the starter 12 at this moment. Therefore, the battery current increases sharply and reaches the maximum of the discharge current value Ib. Thereafter, the battery current decreases while fluctuating with the increase of the engine speed. When the engine 10 reaches a certain rotational speed above which the engine 10 can run by itself, that is, when the engine 10 has been started up, the battery 11 starts to be charged by the alternator 13.

The value of the discharge current of the battery 11 in the case of jump starting of the engine 10 is smaller than that in the case of normal starting of the engine 10 until the engine 10 has been started up. After start of supply of electric power to the starter 12, the inrush current changes sharply, and fluctuates greatly during the period of rotating the crankshaft of the engine 10. Accordingly, the timing to detect the discharge current value Ib is set within a period in which the inrush current is not present and before the engine 10 is started up.

In this embodiment, the period in which the inrush current flows and the period after the engine 10 is detected to have been started up are regarded as a "mask period", and the battery current is detected in a period other than the mask period. Here, the value of the battery current detected at the timing of completion of start-up of the engine 10 (the complete combustion timing) is set as the discharge current value Ib of the battery 11. The jump-start determination is made based on whether or not the discharge current value Ib is larger than a predetermined threshold value Th. At the complete combustion timing, the starter 12 is in a no-load state in which no rotational load to rotate the crankshaft of the engine is present. In this no-load state, variation of detection of the discharge current value Ib is small.

Figure 5:
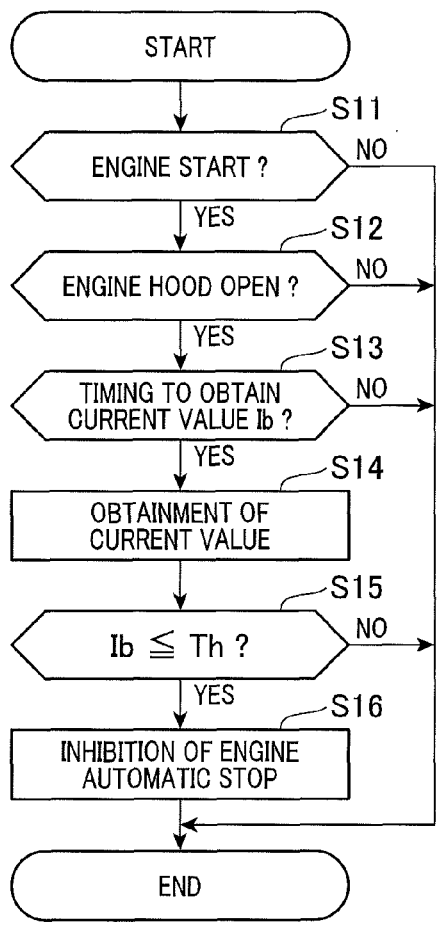
FIG. 5 is a flowchart showing steps of a process for making a jump-start determination.

Next, a process for making the jump-start determination is explained with reference to the flowchart of FIG. 5. This process is performed repeatedly at regular time intervals by the ECU 15.

This process begins in step S11 where it is determined whether or not the engine 10 is going to be started. If the determination result in step S11 is affirmative, the process proceeds to step S12, and otherwise the process is terminated.

In step S12, it is determined whether or not the engine hood is open. If the determination result in step S12 is affirmative, the process proceeds to step S13, and otherwise the process is terminated. Step S12 may be modified to determine whether or not the door of the own vehicle is open to access the battery 11 if the battery 11 is disposed in the cabin.

In step S13, it is determined whether or not it is timing to obtain the discharge current value Ib. For example, it is determined whether it is the timing of completion of start-up (the complete combustion timing). If the determination result in step S13 is affirmative, the process proceeds to step S14, and otherwise the process is terminated. In step S14, the battery current detected by the current sensor 17 is obtained as the discharge current value Ib.

In subsequent step S15, it is determined whether or not the discharge current value Ib is smaller than or equal to the threshold value Th. If the determination result in step S13 is affirmative, the process proceeds to step S16, and otherwise the process is terminated. In step S16, it is determined that the engine 10 has been jump-started, and inhibits the engine 10 from being stopped automatically. Incidentally, if it is determined that the engine 10 has been jump-started, control to promote power generation of the alternator 13 or control to supply electric power preferentially to higher-priority loads may be performed in addition to inhibiting the engine 10 from being stopped automatically.

Figure 6:
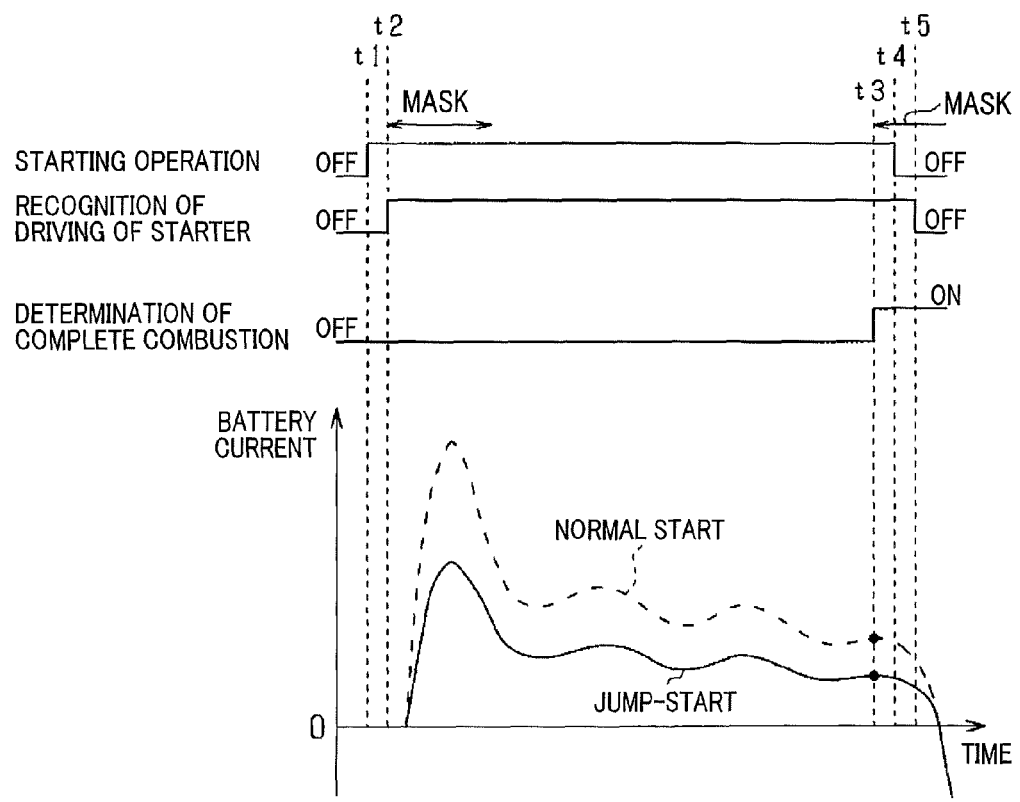
FIG. 6 is a time chart for explaining an example of an operation for starting the engine.

Next, an example of an operation for starting the engine 10 is explained with reference to the time chart of FIG. 6.

The starter 12 is driven at time t1 by an operation of the ignition key. The ECU 15 recognizes that the starter 12 starts to operate at time t2. Subsequently, the battery 11 starts to discharge. As shown in FIG. 6, the battery current depends on whether the engine 10 has been started normally or jump-started. Thereafter, at a moment when the engine speed reaches the complete combustion speed at time t3, the battery current is detected as the discharge current value Ib. Subsequently, the jump-start determination is made based on the discharge current value Ib.

Incidentally, the way to detect the complete combustion state is not limited to the one described above. For example, it is possible to determine that the engine has reached the complete combustion state upon detecting that the pinion of the starter 12 is being driven to rotate by the ring gear of the crankshaft of the engine 10, that is, that the pinion is in a no-load state. More specifically, it is possible to determine that the engine has reached the complete combustion state upon detecting that the torque which the pinion of the starter 12 applies to the ring gear becomes smaller than a predetermined value, or when the change rate of the torque is larger than a predetermined value.

Thereafter, the operation of the ignition key is ended at time t4, and the ECU 15 recognizes that the engine 10 has been started up at time t5. Incidentally, in the example of FIG. 6, each of the period starting from time t2 and continuing for a certain time and the period after time t3 is a mask period. If the operation of the ignition key is ended before detecting the complete combustion state of the engine 10, the period after the end of the operation is set as the mask period.

The above described embodiment of the invention provides the following advantages.

Since the discharge current value Ib which is the value of the discharge current flowing out from the battery 11 of the own vehicle 7 is obtained, it is possible to perform the jump-start determination correctly irrespective of the power generation state of the rescue vehicle 30. Further, since a determination whether engine starting is completed can be made even when the discharge current value Ib of the battery 11 of the own vehicle 7 is small, it is possible to correctly determine that the jump-start has been made.

The jump-start determination is made based on the discharge current value Ib obtained when the speed of the engine 10 has reached the complete combustion determination speed. Accordingly, since variation of the discharge current value Ib is small, the jump-start determination can be made with a high degree of accuracy.

The discharge current value Ib can be obtained in a period other than the period immediately after start of supply of electric power to the starter 12 in which a large current flows. Accordingly, it is possible to make a comparison correctly between the discharge current value Ib and the threshold without excessively increasing the detectable range of the current sensor 17.

In the above embodiment, it is determined that the engine 10 has been jump-started if the engine 10 has been started up with the engine hood of the own vehicle 7 being open, and the discharge current value Ib is detected to be smaller than the threshold value Th. Accordingly, it is possible to set the threshold value Th to the safety side (the side at which the engine 10 is apt to be determined to have been jump-started) in terms of ensuring robustness.

Other Embodiments

The above described embodiment may be modified as described below.

The ECU 15 may be configured to variably set the threshold value Th. For example, the ECU 15 may be configured to obtain the driven state of the electrical loads 14 as a factor affecting the discharge current value Ib, and set the threshold value Th in accordance with the driven state of the electrical loads 14. In this case, the threshold value Th is set higher when power consumed by the electrical loads 14 is larger and accordingly the discharge current value Ib is larger. Further, the threshold value Th may be set variably in accordance with not only the driven state of the electrical loads 14, but also the outdoor temperature or the traveling distance of the own vehicle, which affects the discharge current value Ib.

Variably setting the threshold value Th as described above makes it possible to make the jump-start determination correctly even when the driven state of the electrical loads 14 fluctuates, causing the discharge state of the battery 11 to fluctuate.

The threshold value Th may be set depending on the number of times that the starter 12 is driven. In this case, the threshold value Th is set smaller when the number of times that the starter 12 is driven is greater and accordingly the starter 12 is assumed to be more deteriorated.

The threshold value Th may be set depending on the number of times that the ignition key is operated. When the number of times that the ignition key is operated is greater, that is, when the number of times that engine start fails is greater, it can be assumed that the battery 11 is more deteriorated. Accordingly, when the number of times that the ignition key is operated is greater, the threshold value Th is set larger so that the engine 10 is apt to be determined to have been jump-started.

In the above embodiment, the jump-start determination is made based on the discharge current value Ib which is the value of the discharge current when the engine speed has reached the complete combustion determination speed. However, the discharge current value Ib may be the maximum value of the battery current (the peak value of the inrush current) after start of supply of electric power to the starter 12, or the value of the battery current at a moment after an elapse of a predetermined time since start of supply of electric power to the starter 12, or the average value of the battery current during a period in which the starter 12 is supplied with electric power.

In the above embodiment, the engine 10 of the own vehicle 7 is jump-started using electric power supplied from the battery 31 of the rescue vehicle 30. However, the engine 10 of the own vehicle 7 may be jump-started using electric power supplied from a power supply connectable to the battery 7 of the own vehicle 7, such as a household emergency electric power supply.

The above explained preferred embodiments are exemplary of the invention of the present application which is described solely by the claims appended below. It should be understood that modifications of the preferred embodiments may be made as would occur to one of skill in the art.

What is claimed is:

1. A battery monitoring apparatus for a vehicle including a battery and a starter for starting an engine thereof by using electric power supplied from the battery, comprising:
    a current obtaining section that obtains, as a discharge current value, a value of a discharge current flowing out from the battery while the engine is being started;
    a current determination section that determines whether or not the discharge current value is smaller than a predetermined threshold value;
    a start determination section that determines whether or not the engine has been started up; and
    a jump-start determination section that determines that the engine has been jump-started if the discharge current value is determined to be smaller than the threshold value and the engine is determined to have been started up.

2. The battery monitoring apparatus according to claim 1, wherein, when positive side and negative side terminals of the battery are connected with positive side and negative side booster cables, respectively, the current obtaining section obtains, as the discharge current value, a value of a current flowing between the positive terminal and the positive side booster cable, or a value of a current flowing between the negative terminal and the negative side booster cable.

3. The battery monitoring apparatus according to claim 2, further comprising a first wire connected to the positive terminal, a second wire connected to the negative terminal, and a current detection section that detects one of a current flowing through the first wire and a current flowing through the second wire, wherein
    the current obtaining section obtains, as the discharge current value, a value of a current flowing through the current detection section in a state of being connected between one of the positive and negative terminals and one of the positive side and negative side booster cables.

4. The battery monitoring apparatus according to claim 1, wherein the current determination section determines whether or not the discharge current value is smaller than the threshold value at a time after an elapse of a predetermined time since start of supply of electric power to the starter and before the engine reaches a complete combustion state.

5. The battery monitoring apparatus according to claim 1, wherein the current determination section determines whether or not the discharge current value is smaller than the threshold value at a time when the engine has reached a complete combustion state.

6. The battery monitoring apparatus according to claim 1, further comprising a data acquiring section that acquires data regarding a factor affecting the discharge current value, and a threshold setting section that sets the threshold value in accordance with the data regarding the factor acquired by the data acquiring section.

* * * * *